United States Patent
Lee

(10) Patent No.: US 10,984,717 B2
(45) Date of Patent: Apr. 20, 2021

(54) ORGANIC LIGHT-EMITTING DISPLAY DEVICE

(71) Applicant: Samsung Display Co. Ltd., Yongin-si (KR)

(72) Inventor: Wook Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/827,624

(22) Filed: Nov. 30, 2017

(65) Prior Publication Data

US 2018/0158414 A1 Jun. 7, 2018

(30) Foreign Application Priority Data

Dec. 1, 2016 (KR) .................. 10-2016-0162632

(51) Int. Cl.
*G09G 3/3258* (2016.01)
*H01L 27/32* (2006.01)
*G09G 3/3233* (2016.01)

(52) U.S. Cl.
CPC ......... *G09G 3/3258* (2013.01); *G09G 3/3233* (2013.01); *H01L 27/3276* (2013.01); *G09G 2300/0819* (2013.01); *G09G 2300/0842* (2013.01); *G09G 2300/0861* (2013.01); *G09G 2310/0256* (2013.01); *G09G 2320/0233* (2013.01); *G09G 2320/045* (2013.01)

(58) Field of Classification Search
None
See application file for complete search history.

(56) References Cited

U.S. PATENT DOCUMENTS

| 8,451,196 B2 | 5/2013 | Park et al. | |
|---|---|---|---|
| 9,035,858 B2 | 5/2015 | Kim et al. | |
| 2003/0160745 A1 | 8/2003 | Osame et al. | |
| 2003/0209989 A1 | 11/2003 | Anzai et al. | |
| 2005/0212408 A1* | 9/2005 | Yoshida | G09G 3/3216 313/503 |
| 2008/0007547 A1* | 1/2008 | Hasumi | G09G 3/3233 345/211 |

(Continued)

FOREIGN PATENT DOCUMENTS

| KR | 1020080054764 | 6/2008 |
|---|---|---|
| KR | 1020080072160 | 8/2008 |
| KR | 1020120074847 | 7/2012 |

OTHER PUBLICATIONS

European Search Report dated May 15, 2018—European patent application No. 17205014.8.

(Continued)

*Primary Examiner* — Benjamin C Lee
*Assistant Examiner* — Emily J Frank
(74) *Attorney, Agent, or Firm* — Cantor Colburn LLP

(57) ABSTRACT

An organic light-emitting display device includes a plurality of pixels, each of which is connected to a scan line, a data line, a first power line and a second power line, and includes a light-emitting diode. A voltage applied to an anode of the light-emitting diode is higher than a voltage applied to a cathode in a first operation period, and a voltage applied to the anode of the light-emitting diode is lower than a voltage applied to the cathode in at least a part of a second operation period different from the first operation period.

16 Claims, 13 Drawing Sheets

(56) References Cited

U.S. PATENT DOCUMENTS

| | | | |
|---|---|---|---|
| 2008/0030440 A1* | 2/2008 | Uchino | G09G 3/3233 345/82 |
| 2008/0150846 A1 | 6/2008 | Chung | |
| 2008/0169754 A1 | 7/2008 | Yang et al. | |
| 2009/0262101 A1 | 10/2009 | Nathan et al. | |
| 2010/0013746 A1* | 1/2010 | Seto | G09G 3/3233 345/76 |
| 2010/0134479 A1* | 6/2010 | Takasugi | G09G 3/32 345/214 |
| 2010/0149140 A1* | 6/2010 | Nakamura | G09G 3/3233 345/204 |
| 2011/0193885 A1* | 8/2011 | Lee | G09G 3/3233 345/690 |
| 2014/0092144 A1 | 4/2014 | Kim et al. | |
| 2014/0225838 A1* | 8/2014 | Gupta | G09G 3/3208 345/173 |
| 2015/0009198 A1 | 1/2015 | Park | |
| 2015/0145849 A1* | 5/2015 | Choi | G09G 3/3233 345/212 |
| 2016/0125803 A1 | 5/2016 | Qing et al. | |
| 2018/0169754 A1 | 6/2018 | Rosi et al. | |

OTHER PUBLICATIONS

Summons—European Application No. 17205014.8 dated May 21, 2019.
The extended European search report for corresponding EP Application No. 19213691.9 dated Jan. 15, 2020.

* cited by examiner

ORGANIC LIGHT-EMITTING DISPLAY DEVICE

This application claims priority to Korean Patent Application No. 10-2016-0162632, filed on Dec. 1, 2016, and all the benefits accruing therefrom under 35 U.S.C. § 119, the content of which in its entirety is herein incorporated by reference.

BACKGROUND

1. Field

The disclosure relates to an organic light-emitting display device.

2. Description of the Related Art

In recent years, various display devices with reduced weight and volume have been developed. Examples of such display devices include a liquid-crystal display ("LCD"), a field emission display ("FED"), a plasma display panel ("PDP"), and an organic light-emitting diode display, etc.

Among these, an organic light-emitting display device displays images by using organic light-emitting diodes ("OLED"s) in which holes and electrons are recombined to generate light. An organic light-emitting display device has been attracting attention because the organic light-emitting display has a fast response speed and is driven with low power, as well as having high luminous efficiency, high brightness and an improved viewing angle.

Organic light-emitting display devices may be classified into a passive matrix display device and an active matrix display device depending on the driving manner. In a passive matrix display device, anodes and cathodes cross each other to form a matrix in a screen display area, and pixels are formed at intersections of the anodes and the cathodes. In an active matrix display device, a thin film transistor is disposed every pixel, and each pixel is controlled using the thin film transistor.

The main difference between the active and passive matrix display devices lies in the difference in the emission time of the organic light-emitting display devices. Specifically, the passive matrix display device allows the organic emission layer to emit light at a high luminance instantaneously, but the active matrix display device allow the organic light emitting layer to emit light at a low luminance continuously.

The active matrix display device has advantages such as smaller parasitic capacitance and smaller power consumption compared to the passive matrix display device, but has a disadvantage of uneven luminance. To solve this problem, characteristics of a driving transistor are compensated by using a voltage writing scheme or a current writing scheme.

Specifically, each pixel of the active matrix organic light-emitting display device includes an OLED, a driving transistor for controlling current for driving the OLED, a switching transistor for applying a data signal for grayscale representation to the driving transistor, and a capacitor for driving the driving transistor for a predetermined time to allow the OLED to emit light as desired. In operation, the voltage difference between the source and the gate of the driving transistor is stored in the capacitor, and then the driving transistor is connected to the voltage source so that a current corresponding to a video signal current flows in the driving transistor. Accordingly, the value of the current applied to the OLED becomes the value of the current input as the video signal, such that the luminance unevenness may be improved, irrespective of the difference in the device characteristics of the driving transistor.

SUMMARY

However, according to the above scheme, an organic light-emitting diode ("OLED") may be turned on/off by switching of the driving transistor, and the anode electrode of the OLED may be floated when the driving transistor is turned off such that the constant voltage lifetime of the OLED is shortened. In addition, since the voltage applied to the anode electrode of the OLED is equal to or higher than the voltage applied to the cathode electrode, the efficiency of the OLED itself may be degraded. Further, the characteristics of the device may be deteriorated at the interface inside the OLED formed in a stack structure, and thus the lifetime of the OLED may be shortened.

Accordingly, a structure capable of supplying a reverse bias to the OLED is desired so that the voltage of the anode electrode of the OLED has a voltage level lower than the voltage of the cathode electrode.

In an exemplary embodiment, an organic light-emitting display device includes: a plurality of pixels, where each of the pixels is connected to a scan line, a data line, a first power line and a second power line, and each of the pixels includes a light-emitting diode. In such an embodiment, a voltage applied to an anode of the light-emitting diode in a first operation period is higher than a voltage applied to a cathode of the light-emitting diode in the first operation period, and a voltage applied to the anode of the light-emitting diode in a part of a second operation period, which is different from the first operation period, is lower than a voltage applied to the cathode of the light-emitting diode in the part of the second operation period.

Embodiments of the disclosure, as described herein, provide an organic light-emitting display device in which a reverse bias is applied to an OLED therein.

BRIEF DESCRIPTION OF THE DRAWINGS

The above and other aspects and features of the invention will become more apparent by describing in detail exemplary embodiments thereof with reference to the attached drawings, in which.

DETAILED DESCRIPTION

Figure 1:
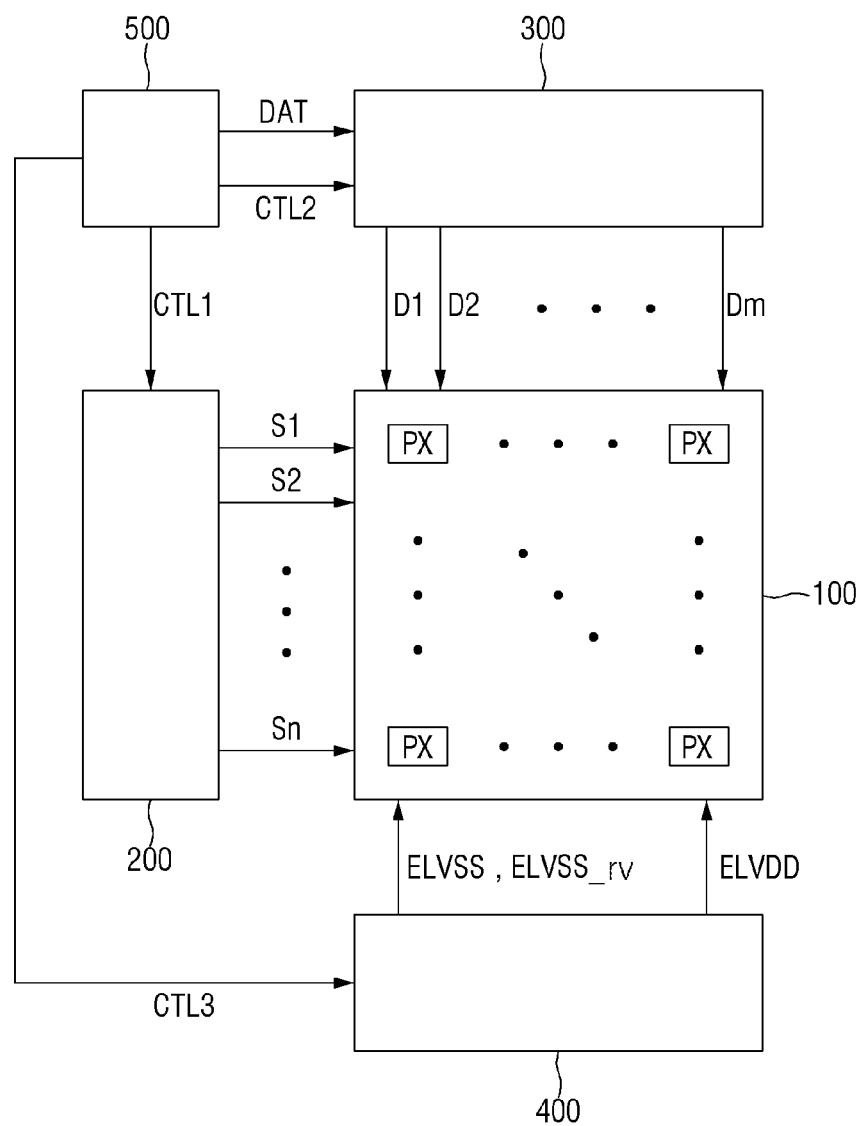
FIG. 1 is a block diagram of an organic light-emitting display device according to an exemplary embodiment of the disclosure.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

In the invention, an electronic apparatus may be any apparatus provided with a display device. Examples of the electronic apparatus may include smart phones, mobile phones, navigators, game machines, TVs, car head units, notebook computers, laptop computers, tablet computers, personal media players ("PMP"s), and personal digital assistants ("PDA"s). The electronic apparatus may be embodied as a pocket-sized portable communication terminal having a wireless communication function. Further, the display device may be a flexible display device capable of changing its shape.

Hereinafter, embodiments of the invention will be described with reference to the accompanying drawings.

FIG. 1 is a block diagram of an organic light-emitting display device according to an exemplary embodiment of the disclosure.

Referring to FIG. 1, an exemplary embodiment of the organic light-emitting display device includes a display panel 100, a scan driver 200, a data driver 300, a power supplier 400, and a controller 500.

The display panel 100 includes a plurality of scan lines SL (shown in FIG. 3), a plurality of data lines DL (shown in FIG. 3) intersecting the scan lines SL, and a plurality of pixels PX. The scan lines SL may be electrically connected to the scan driver 200. The data lines DL may be electrically connected to the data driver 300. The display panel 100 may include m×n pixels PX, each located at an intersection of a corresponding scan line SL and a corresponding data line DL. However, the arrangement of the pixels PX is not limited to the m×n matrix form. In alternative exemplary embodiments, the pixels PX may be arranged in various other shapes such as a circular shape.

The scan driver 200 receives a scan driving control signal CTL1 from the controller 500 to generate scan signals S1 to Sn, and sequentially applies the scan signals S1 to Sn to the plurality of scan lines SL connected to the pixels PX.

The data driver 300 receives a data driving control signal CTL2 from the controller 500 to generate data signals D1 to Dm, and supplies the data signals D1 to Dm to the plurality of data lines DL connected to the pixels PX.

The power supplier 400 receives a power supply control signal CTL3 from the controller 500 and generates a first supply voltage ELVDD, a second supply voltage ELVSS and a third supply voltage ELVSS_rv. The first supply voltage ELVDD may be applied to the pixels PX via a first power line PL1 (shown in FIG. 3). The second supply voltage ELVSS and the third supply voltage ELVSS_rv may be applied to the pixels PX via a second power line PL2 (shown in FIG. 3).

In an exemplary embodiment, the second supply voltage ELVSS may have a voltage level lower than that of the first supply voltage ELVDD. In such an embodiment, the third supply voltage ELVSS_rv may have a voltage level higher than that of the first supply voltage ELVDD. Accordingly, when the first supply voltage ELVDD is applied to the pixels PX via the first power supply line PL1 of FIG. 3 and the third supply voltage ELVSS_rv is applied to the pixels PX via the second power line PL2 of FIG. 3, a reverse bias may be applied to the OLED, and the display quality of the organic light-emitting display device may be improved. Such features thereof will be described later in greater detail.

The controller 500 converts image signals transmitted from an outside (e.g., an external system) into image data signals DAT and provides the image data signals DAT to the data driver 300. The controller 500 receives a vertical synchronization signal (not shown), a horizontal synchronization signal (not shown), and a clock signal (not shown) to generate control signals CTL1 to CTL3 for driving the scan driver 200, the data driver 300 and the power supplier 400 to provide the control signals CTL1 to CTL3 thereto, respectively. In such an embodiment, the controller 500 generates the scan driving control signal CTL1 for controlling the scan driver 200, the data driving control signal CTL2 for controlling the data driver 300, and the power supply control signal CTL3 for controlling the power supplier 400, and provides the control signals CTL1 to CTL3 to the scan driver 200, the data driver 300 and the power supplier 400, respectively.

Figure 2:
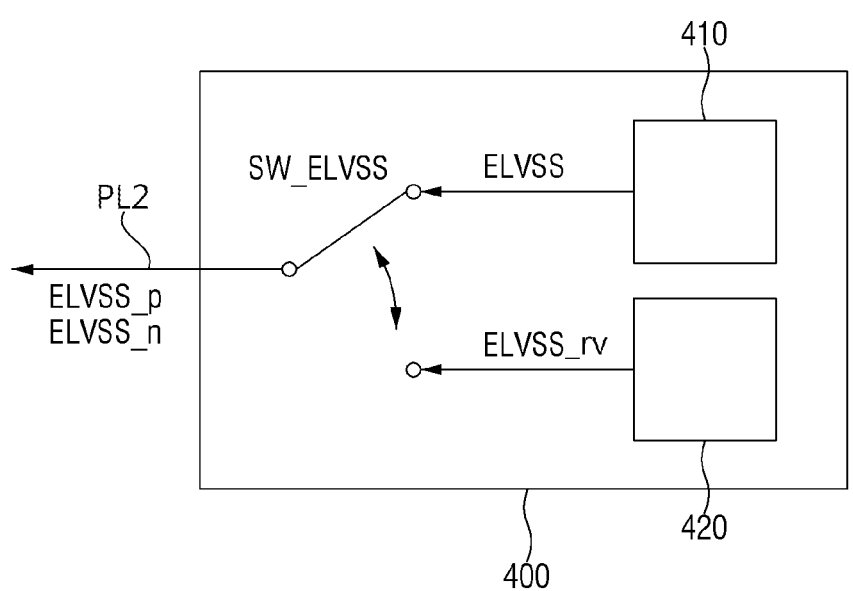
FIG. 2 is a block diagram showing a structure of a power supplier of FIG. 1 in detail.

FIG. 2 is a block diagram showing a structure of the power supplier of FIG. 1 in detail.

Referring to FIG. 2, the power supplier 400 includes a second supply voltage supplying unit 410 and a third supply voltage supplying unit 420, and a power switching element SW_ELVSS.

The second supply voltage supplying unit 410 may generate the second supply voltage ELVSS and may provide the second supply voltage ELVSS to the second power line PL2.

The third supply voltage supplying unit 420 may generate the third supply voltage ELVSS_rv and may provide the third supply voltage ELVSS_rv to the second power line PL2.

The power switching element SW_ELVSS may select a voltage to be supplied to the second power line PL2. The power switching element SW_ELVSS may connect the second supply voltage supplying unit 410 with the second power line PL2 or may connect the third supply voltage supplying unit 420 with the second power line PL2. The power switching element SW_ELVSS may be in an area (not shown) other than the area (not shown) where the display part 100 (see FIG. 1) of the organic light-emitting display device is disposed. The type and form of the switching element is not particularly limited.

Figure 4:
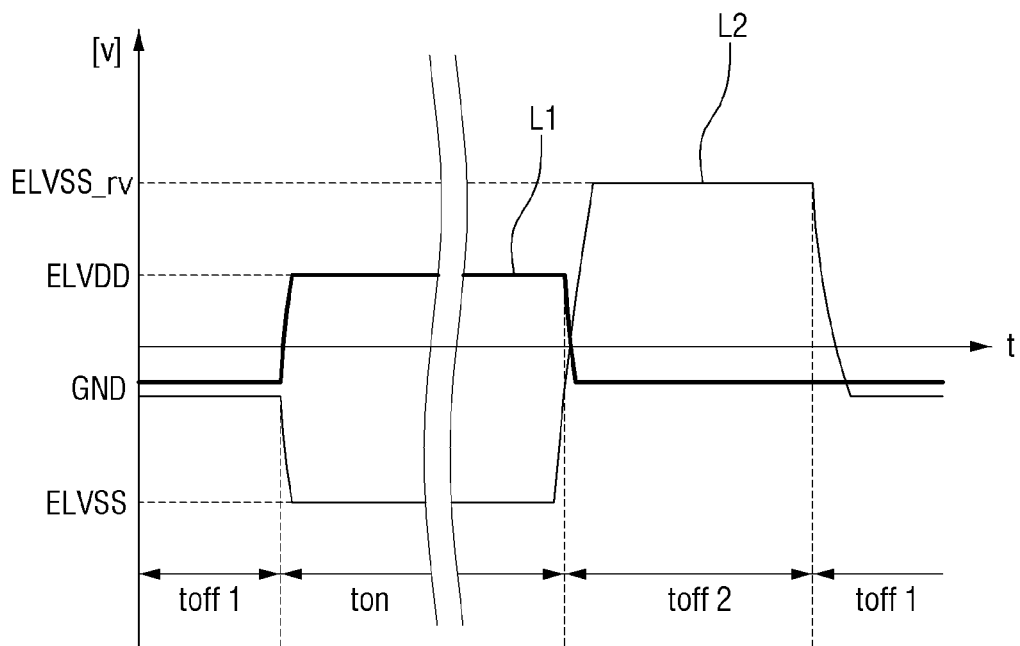
FIG. 4 is a signal timing diagram of an exemplary embodiment of signals supplied to a first power line and a second power line.

Although not shown in the drawings, when the organic light-emitting display device is turned off, the second supply voltage supplying unit 410 may supply a ground voltage GND (see FIG. 4), and the third supply voltage supplying unit 420 may supply the third supply voltage ELVSS_rv or the ground voltage GND (see FIG. 4). In such an embodiment, when the organic light-emitting display device is turned off, the power supplier 400 may be maintained in one of two different states. In such an embodiment, when the organic light-emitting display device is turned off, the power supplier 400 may be maintained in a first power-off mode in which the second supply voltage supplying unit 410 supplies the ground voltage GND (see FIG. 4), and the third supply voltage supplying unit 420 supplies the third supply voltage ELVSS_rv. In such an embodiment, when the organic light-emitting display device is turned off, the power supplier 400 may also be maintained in a second power-off mode in which the second supply voltage supplying unit 410 supplies the ground voltage GND (see FIG. 4), and the third supply voltage supplying unit 420 also supplies the ground voltage GND (see FIG. 4).

In an embodiment, when the organic light-emitting display device is maintained in the first power-off mode, the ground voltage GND (see FIG. 4) is supplied to the second power line PL2, such that the organic light-emitting display device may not substantially consume power.

In an embodiment, when the organic light-emitting display device is maintained in the second power-off mode, the organic light-emitting display device may substantially consume power, and the third supply voltage ELVSS_rv may be supplied to the second power line PL2. Accordingly, the display quality of the organic light-emitting display device may be improved.

When the organic light-emitting display device is turned off, the organic light-emitting display device remains mostly in the second power-off mode, and the organic light-emitting display device in the first power-off mode for a relatively short period of time. A description thereof will be given below with reference to FIG. 4.

Although the second supply voltage supplying unit 410 and the third supply voltage supplying unit 420 may be separate modules in an exemplary embodiment, but not being limited thereto. In an alternative exemplary embodiment, the power supplier 400 included in the organic light-emitting display device may selectively apply the second supply voltage ELVSS and the third supply voltage ELVSS_rv by using a single module. In such an embodiment, the power supplier 400 may not include any additional switch, other than the module capable of selectively applying the second supply voltage ELVSS or the third supply voltage ELVSS_rv.

Figure 3:
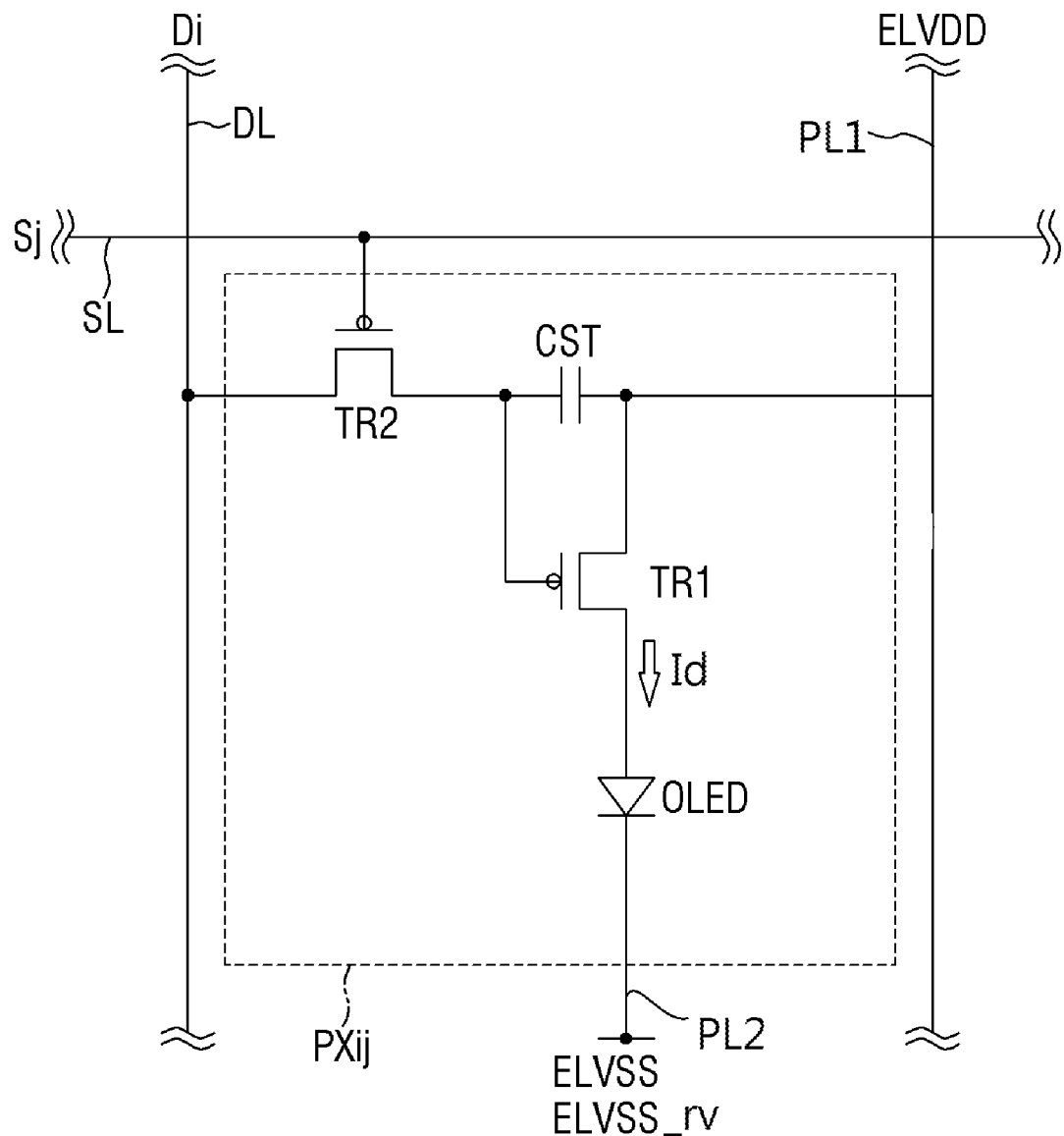
FIG. 3 is a circuit diagram of an exemplary embodiment of a pixel of the organic light-emitting display device of FIG. 1.

FIG. 3 is a circuit diagram of an exemplary embodiment of a pixel of the organic light-emitting display device of FIG. 1.

Referring to FIG. 3, an exemplary embodiment of a pixel PXij of the organic light-emitting display device includes an organic light-emitting diode ("OLED"), a first transistor TR1, a second transistor TR2, and a storage capacitor CST.

The OLED may emit light based on a driving current Id. The OLED includes a first terminal and a second terminal. The first terminal of the OLED may receive the first supply voltage ELVDD, and the second terminal of the OLED may receive the second supply voltage ELVSS or the third supply voltage ELVSS_rv. The first terminal of the OLED may be an anode and the second terminal of the OLED may be a cathode.

The first transistor TR1 includes a control terminal, a first terminal, and a second terminal. In an exemplary embodiment, the first transistor TR1 may operate in the saturation region. In such an embodiment, the first transistor TR1 may generate the driving current Id based on the voltage difference between the control terminal and the first terminal of the first transistor TR1. In such an embodiment, a grayscale may be represented based on the magnitude of the driving current Id supplied to the OLED. However, this is merely exemplary. In an alternative exemplary embodiment, the first transistor TR1 may operate in a linear region. In such an embodiment, the grayscale may be represented based on the sum of the times for which the driving current Id is supplied to the OLED within one frame.

The second transistor TR2 includes a control terminal, a first terminal, and a second terminal. The control terminal of the second transistor TR2 may be electrically connected to a scan line SL to receive a scan signal Sj. The first terminal of the second transistor TR2 may be electrically connected to a data line DL to receive a data signal Di. The second terminal of the second transistor TR2 may be electrically connected to the first terminal of the first transistor TR1. In an exemplary embodiment, the first terminal of the second transistor TR2 may be a source terminal and the second terminal of the second transistor TR2 may be a drain terminal. However, this is merely exemplary. In an alternative exemplary embodiment, the first terminal of the second transistor TR2 may be a drain terminal and the second terminal of the second transistor TR2 may be a source terminal.

The second transistor TR2 may provide the data signal Di to the control terminal of the first transistor TR1 during an activation period of the scan signal Sj. Herein, the activation period of the scan signal Sj refers to a period in which the scan signal Sj has a voltage level that turns on the second transistor TR2.

The storage capacitor CST is electrically connected between the first power line PL1 and the control terminal of the first transistor TR1. The storage capacitor CST may hold the voltage level of the control terminal of the first transistor TR1 during a deactivation period of the scan signal Sj. Herein, the deactivation period of the scan signal Sj refers to a period in which the scan signal Sj has a voltage level that turns off the second transistor TR2. The driving current Id generated by the first transistor TR1 may be supplied to the OLED during the deactivation period of the scan signal Sj. Therefore, even when the second transistor TR2 is turned off, the driving current generated by the first transistor TR1 may be supplied to the OLED based on the voltage level held by the storage capacitor CST.

However, the elements of the pixel PX are not limited to the above-described elements. In an alternative exemplary embodiment, the pixel PX may further include other types of transistors and electronic elements. In one exemplary embodiment, for example, each pixel PX may include more transistors to compensate the deterioration of the organic light-emitting display device.

FIG. 4 is a signal timing diagram of an exemplary embodiment of signals provided to the first power line and the second power line.

In the graph shown in FIG. 4, the x-axis represents the elapsed time, and the y-axis represents the voltage level. More particularly, the x-axis may represent time in second, and the y-axis may represent voltage in volt (V). In FIG. 4, a first line L1 represents the voltage level of the signal supplied to the first power line PL1, and a second line L2 represents the voltage level of the signal supplied to the second power line PL2.

Referring to FIG. 4, in an exemplary embodiment of the organic light-emitting display device, the signal supplied to the first power line PL1 and the signal supplied to the second power line PL2 in the first power-off period toff1, in which the organic light-emitting display device is in the first power-off mode, both of the signal supplied to the first power line PL1 and the signal supplied to the second power line PL2 may have a voltage level of the ground voltage GND. In the first power-off period toff1, in each pixel PX, the voltage at the first terminal of the OLED may be substantially equal to the voltage at the second terminal of the OLED, and the organic light-emitting display device may not substantially consume power. The ground voltage GND may have a voltage level in a range from about −2 V to about zero (0) V. However, this is merely exemplary. The ground voltage may have different voltage levels depending on the initial setting value.

Then, during the power-on period ton in which the organic light-emitting display device is turned on, the first power line PL1 is supplied with the first supply voltage ELVDD, and the second power line PL2 is supplied with the second supply voltage ELVSS.

The first supply voltage ELVDD may have a higher value than the second supply voltage ELVSS. In one exemplary embodiment, for example, the first supply voltage ELVDD may have a voltage level in a range of about 4 V to about 6 V, and the second supply voltage ELVSS may have a voltage level in a range of about −4 V to about zero (0) V.

The first supply voltage ELVDD may be supplied to the first terminal of the OLED in each pixel PX. The second supply voltage ELVSS may be supplied to the second terminal of the OLED in each pixel PX. Accordingly, the voltage supplied to the first terminal of the OLED may have a higher value than the voltage supplied to the second terminal of the OLED. Accordingly, a forward bias is applied to the OLED so that the driving current Id may flow through the OLED to allow the OLED to emit light.

In such an embodiment, the voltage supplied to the first terminal of the OLED in each pixel PX has a value obtained by subtracting the threshold voltage of the first transistor TR1 from the voltage level of the first supply voltage ELVDD. However, the threshold voltage of the first transistor TR1 is smaller than the difference in voltage level between the first supply voltage ELVDD and the second supply voltage ELVSS, and thus the forward bias may still be provided to the OLED. Therefore, such error is not shown in the drawings for convenience of illustration.

Then, in the second power-off period toff2 in which the organic light-emitting display device is in the second power-off mode, the first power line PL1 may be supplied with the ground voltage GND, and the second power line PL2 may be supplied with the third supply voltage ELVSS_rv.

The ground voltage GND may have a lower value than the third supply voltage ELVSS_rv. In one exemplary embodiment, for example, the ground voltage GND may have a voltage level in a range of about −2 V to about zero (0) V as described above, and the third supply voltage ELVSS_rv may have a voltage level in a range of about 5 V to about 7 V.

In the second power-off period toff2, in each pixel PX, the ground voltage GND may be supplied to the first terminal of the OLED, and the third supply voltage ELVSS_rv may be supplied to the second terminal of the OLED. Accordingly, the voltage supplied to the first terminal of the OLED may have a lower value than the voltage supplied to the second terminal of the OLED. Accordingly, a reverse bias is applied to the OLED so that no current flows through the OLED to prevent the OLED from emitting light. In the second power-off period toff2, since the reverse bias is applied to the OLED, the efficiency of the OLED is effectively prevented from being lowered, and the characteristics of the device may be recovered at the interface inside the OLED having a stack structure, or traps and the like in the OLED may be removed. Accordingly, the lifetime of the OLED may be increased, and the display quality of the organic light-emitting display device is thereby improved.

Subsequently, the organic light-emitting display device may be operated in the first power-off period toff1 that is the first power-off mode. The operation of such first power-off period toff1 may be the same as the operation of the first power-off period toff1 described above, and thus the organic light-emitting display device may not substantially consume power and may not display an image in the first power-off period toff1.

In such an embodiment, the power-on period ton may have various time ranges without being limited to the specific time since the power-on period depends on the time for which a user uses the organic light-emitting display device.

In an exemplary embodiment, the second power-off period toff2 may be set to be maintained for a predetermined period of time immediately after the power-on period ton ends. In such an embodiment, the second power-off period toff2 is maintained for a predetermined period of time immediately after the user powers off the organic light-emitting display device, thereby allowing a reverse bias to flow through the OLED. By allowing a reverse bias to flow through the OLED, the display quality of the organic light-emitting display device may be improved and the lifespan thereof may be elongated.

The duration of the second power off period toff2 may have various values depending on a setting value. In an exemplary embodiment, the second power off period toff2 may be maintained for a few hundreds of milliseconds to a few seconds at least, or for a few minutes or even for a few tens of minutes at most. The display quality of the organic light-emitting display device is further improved and the lifetime is further elongated in proportion to the duration of the second power-off period toff2. However, a small amount of power is consumed even after the user turns off the power supply. Accordingly, the duration of the second power-off period toff2 may be adjusted in consideration of the increased power consumption.

In an exemplary embodiment, as shown in FIG. 4, the second power-off period toff2 follows immediately after the power-on period ton has been terminated, but not being limited thereto. In an alternative exemplary embodiment, the second power-off period toff2 may be maintained for a certain period of time before entering the power-on period ton, or may be set to maintained for a certain period of time even during the power-on period ton depending on the user's setting. In an exemplary embodiment, the second power-off period toff2 may be maintained for a certain period of time even while the first power-off period toff1 is maintained. In such an embodiment, the power-on period ton, the first power-off period toff1, and the second power-off period toff2 may be maintained according to the user's setting without being limited to a particular order.

Hereinafter, the effect of applying the reverse bias to the OLED in each pixel PX will be described with reference to FIG. 5.

Figure 5:
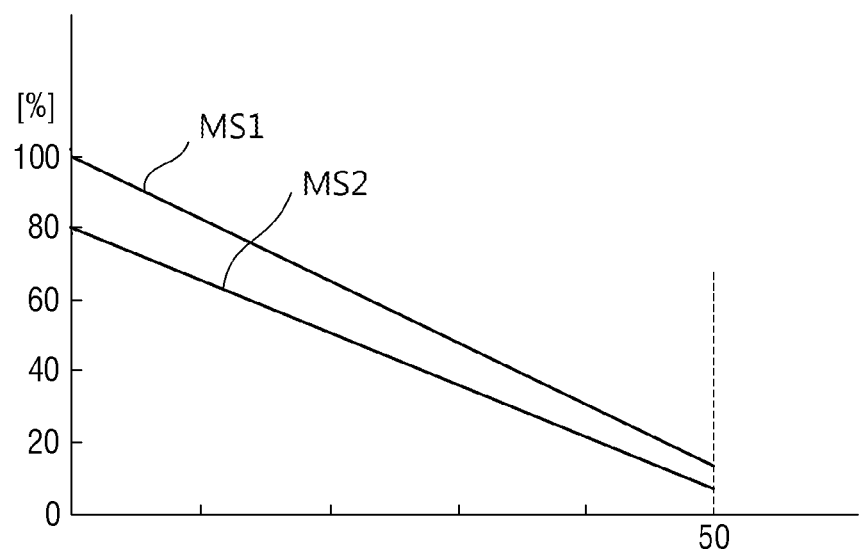
FIG. 5 is a graph showing a difference in current before and after degradation of a display part.

FIG. 5 is a graph showing difference in current before and after degradation of the display part.

In FIG. 5, the x-axis represents pixels PX in the display part 100 (see FIG. 1) arranged in the horizontal direction. More particularly, the graph shows measurements of fifty pixels PX of FIG. 1. Accordingly, the value 1 in the x-axis represent the first pixel of the fifty pixels PX, and the value 50 in the x-axis represent the 50$^{th}$ pixel of the fifty pixels PX.

In FIG. 5, the y-axis represents a ratio of currents flowing in the OLED (see FIG. 3) measured before and after the degradation in each of the pixels PX of FIG. 1. In addition, a first measurement MS1 was obtained from a comparative embodiment in which no reverse bias is applied to the OLED (see FIG. 3) in each pixel PX of FIG. 1. A second measurement MS2 was obtained from an exemplary embodiment of the disclosure after a reverse bias had been applied to the OLED (see FIG. 3) in each pixel PX of FIG. 1.

It is assumed that the difference in current of the first pixel PX (see FIG. 3) before and after the degradation in the comparative embodiment where no reverse bias is applied is 100%.

The first pixel PX is the pixel emitted light at the highest luminance and was degraded maximally. The 50$^{th}$ pixel PX is the pixel emitted light at the lowest luminance and was degraded minimally. That is, the closer a pixel is to the first pixel PX (see FIG. 1), the more the pixel has been degraded. The closer a pixel is to the 50$^{th}$ pixel PX (see FIG. 1), the less the pixel has been degraded.

Referring to FIG. 5, in the comparative embodiment, where no reverse bias is applied, in the first pixel PX (see FIG. 1) which has been degraded most, there is the difference in current of 100% before deterioration and after deterioration. In the exemplary embodiment, when a reverse bias is applied, in the first pixel PX (see FIG. 1), there is the difference in current of 80% before deterioration and after deterioration. That is, when the reverse bias is applied, the difference in current flowing in the OLED (see FIG. 3) in the pixel PX (see FIG. 1) before and after the degradation is reduced, and thus it may be shown that the OLED is recovered.

In the comparative embodiment, when no reverse bias is applied, in the 50$^{th}$ pixel PX which is less degraded than the first pixel PX, there is the difference in current of 15% before deterioration and after the degradation. In the exemplary embodiment, when a reverse bias is applied, in the 50$^{th}$ pixel PX, there is the difference in current of 10% before and after the degradation. That is, it may be shown that the OLED in the 50$^{th}$ pixel may also be recovered, although less than the first pixel which was more degraded.

Figure 6:
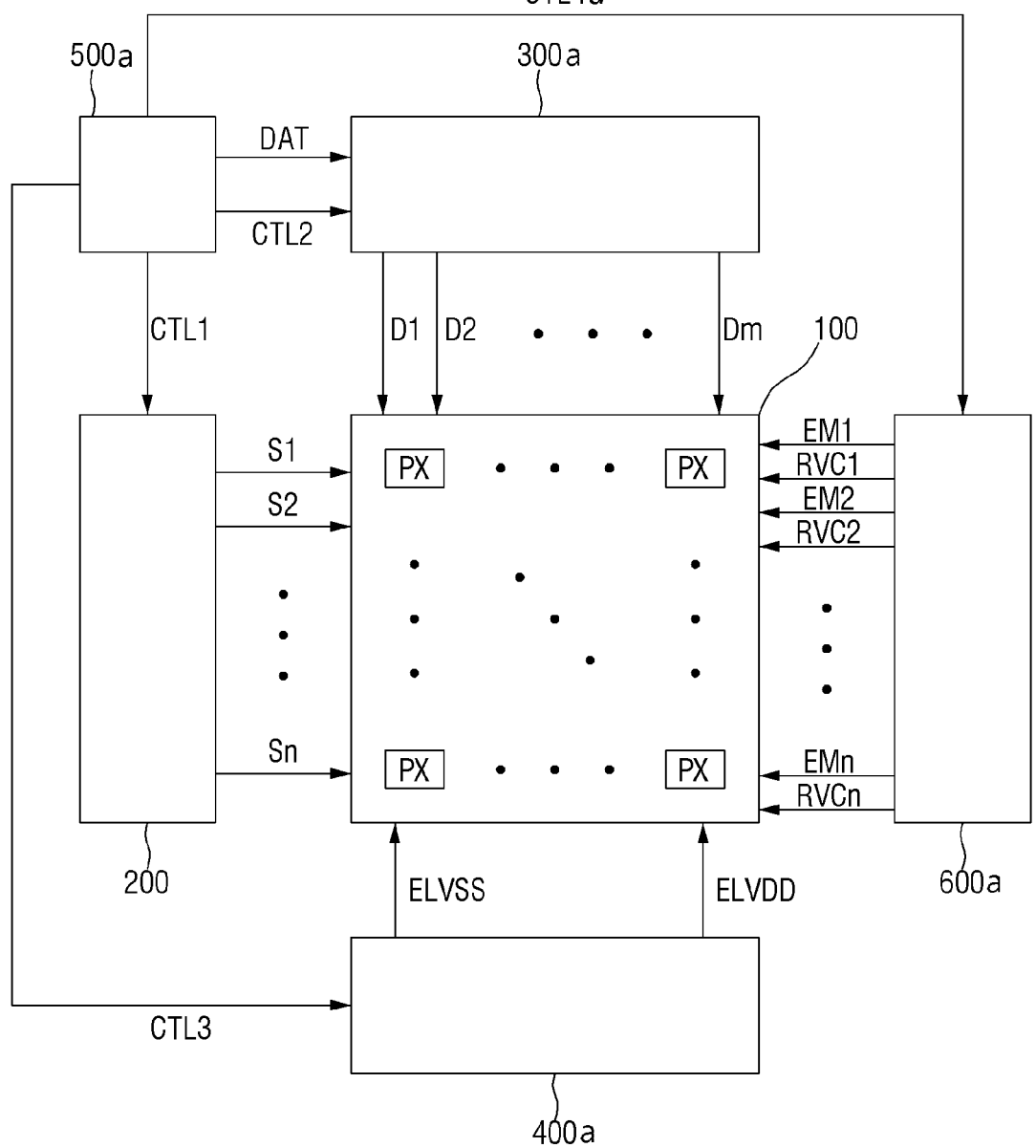
FIG. 6 is a block diagram of an organic light-emitting display device according to an alternative exemplary embodiment of the disclosure.

FIG. 6 is a block diagram of an organic light-emitting display device according to an alternative exemplary embodiment of the disclosure.

The organic light-emitting display device of FIG. 6 is substantially the same as the organic light-emitting display device described above with reference to FIG. 1 except that the organic light-emitting display device further includes an emission control driver 600. The same or like elements shown in FIG. 6 have been labeled with the same or like reference characters as used above to describe the exemplary embodiments of the organic light-emitting display device shown in FIG. 1, and any repetitive detailed description thereof will hereinafter be omitted or simplified.

Referring to FIG. 6, an exemplary embodiment of the organic light-emitting display device includes a display panel 100, a scan driver 200, a data driver 300a, a power supplier 400, a controller 500a, and an emission control driver 600a.

The display panel 100 includes a plurality of scan lines SL, a plurality of data lines DL intersecting the scan lines SL, and a plurality of pixels PX. The display panel 100 is substantially the same as the display panel 100 described above with reference to FIG. 1, and any repetitive detailed description thereof will be omitted.

The scan driver 200 receives a scan driving control signal CTL1 from the controller 500a to generate scan signals S1 to Sn, and sequentially applies the scan signals S1 to Sn to the plurality of scan lines SL connected to the pixels PX.

The data driver 300a receives a data driving control signal CTL2 from the controller 500a to generate data signals D1 to Dm, and supplies the data signals D1 to Dm to the plurality of data lines DL connected to the pixels PX. In such an embodiment, the data signals generated in the data driver 300a are different from those generated in the data driver 300 shown in FIG. 1 in that the data signals may have a lower voltage level than the second supply voltage ELVSS. In such an embodiment, the data driver 300a is substantially the same as the data driver 300 described above with reference to FIG. 1, and any repetitive detailed description thereof will be omitted.

The power supplier 400a receives a power supply control signal CTL3 from the controller 500a and generates a first supply voltage ELVDD and a second supply voltage ELVSS.

The first supply voltage ELVDD may be applied to the pixels PX via a first power line PL1, and the second supply voltage ELVSS may be applied to the pixels PX via a second power line PL2.

In such an embodiment, the power supplier 400a may not generate the third supply voltage ELVSS_rv shown in FIG. 1. in such an embodiment, and thus it may not generate the third supply voltage ELVSS_rv in FIG. 1, and the organic light-emitting display device uses other components than the power supplier 400a to apply a reverse bias to the OLED in each pixel PX. The first supply voltage ELVDD and the second supply voltage ELVSS are substantially the same as those described above with reference to FIG. 1, except for the third supply voltage ELVSS_rv in FIG. 1. Therefore, any repetitive detailed descriptions thereof will be omitted.

The controller 500a converts image signals transmitted from the outside into image data signals DAT and provides the image data signals DAT to the data driver 300a. In such an embodiment, the controller 500a generates the scan driving control signal CTL1 for controlling the scan driver 200, the data driving control signal CTL2 for controlling the data driver 300a, and the power supply control signal CTL3 for controlling the power supplier 400a, and an emission control signal CLT4a for controlling the emission control driver 600a, and provides the scan driving control signal CTL1, the data driving control signal CTL2 and the power supply control signal CTL3 to the scan driver 200, the data driver 300a and the power supplier 400a, respectively. In such an embodiment, the controller 500a may further generate an emission control signal CTL4a for controlling the emission control driver 600a.

Figure 7:
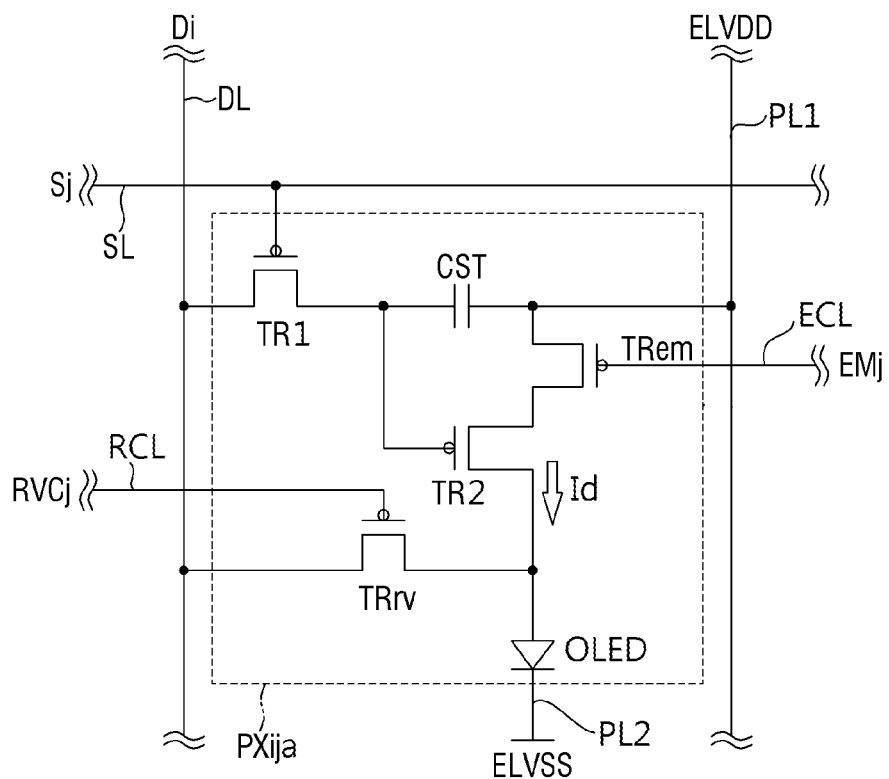
FIG. 7 is a circuit diagram of an example of a pixel of the organic light-emitting display device of FIG. 6.

In an exemplary embodiment, the emission control driver 600a generates first to $n^{th}$ emission control signals EM1 to EMn, and supplies the first to the $n^{th}$ emission control signals EM1 to EMn to the pixels PX of the display part 110 via first to $n^{th}$ emission control lines ECL, respectively (see FIG. 7). In such an embodiment, the emission control driver 600a generates first to $n^{th}$ reverse bias control signals RVC1 to RCVn, and supplies the first to $n^{th}$ reverse bias control signals to the pixels PX of the display part via first to $n^{th}$ reverse bias lines RCL, respectively (see FIG. 7).

The first to $n^{th}$ emission control signals EM1 to EMn may control the driving current Id (see FIG. 7) of the respective pixels PX, thereby controlling emission of the OLED (see FIG. 7) in each of the pixels PX.

In such an embodiment, the first to $n^{th}$ reverse bias control lines RCL may control whether to provide the data signals D1 to Dm provided via the data lines DL to the OLED (see FIG. 7).

FIG. 7 is a circuit diagram of an exemplary embodiment of a pixel of the organic light-emitting display device of FIG. 6.

A pixel PXija of the organic light-emitting display device shown in FIG. 7 is substantially the same as the pixel PXij of the organic light-emitting display device shown in FIG. 3 except that the pixel PXija further includes an emission control transistor TRem and a reverse bias control transistor TRrv. The same or like elements shown in FIG. 7 have been labeled with the same or like reference characters as used above to describe the exemplary embodiments of the pixel shown in FIG. 3, and any repetitive detailed description thereof will hereinafter be omitted or simplified.

Referring to FIG. 7, in an exemplary embodiment, a pixel PXij of the organic light-emitting display device includes an OLED, a first transistor TR1, a second transistor TR2, a storage capacitor CST, an emission control transistor TRem, and a reverse bias control transistor TRrv.

The OLED may emit light based on a driving current Id. The operation of the OLED shown in FIG. 7 is substantially the same as that of the OLED shown in FIG. 3, and any repetitive detailed descriptions thereof will be omitted The first transistor TR1 includes a control terminal, a first terminal, and a second terminal. The operation of the first transistor TR1 shown in FIG. 7 is substantially the same as that of the first transistor TR1 shown in FIG. 3, and any repetitive detailed description thereof will be omitted.

The second transistor TR2 includes a control terminal, a first terminal, and a second terminal. The operation of the second transistor TR2 shown in FIG. 7 is substantially the same as that of the second transistor TR2 shown in FIG. 3, and any repetitive detailed description thereof will be omitted.

The storage capacitor CST is electrically connected between the first power line PL1 and the control terminal of the first transistor TR1. The operation of the storage capacitor CST shown in FIG. 7 is substantially the same as that of the storage capacitor CST shown in FIG. 3, and any repetitive detailed description thereof will be omitted.

The emission control transistor TRem may include a control terminal, a first terminal, and a second terminal. The control terminal of the emission control transistor TRem may be electrically connected to an emission control line ECL to receive an emission control signal EMj. The first terminal of the emission control transistor TRem may be electrically connected to the first power line PL1 to receive the first supply voltage ELVDD. The second terminal of the emission control transistor TRem may be electrically connected to the first terminal of the first transistor TR1. The emission control transistor TRem may control the emission of the OLED. In such an embodiment, the emission control transistor TRem controls the generation of the driving current Id of the first transistor TR1 by controlling the application of the first supply voltage ELVDD to the first terminal of the first transistor TR1. By controlling the generation of the driving current Id of the first transistor TR1, the emission of the OLED may be controlled.

The reverse bias control transistor TRrv may include a control terminal, a first terminal, and a second terminal. The control terminal of the reverse bias control transistor TRrv may be electrically connected to a reverse bias control line RCL to receive a reverse bias control signal RVCj. The first terminal of the reverse bias control transistor TR2 may be electrically connected to a data line DL to receive a data signal Di. The second terminal of the reverse bias control transistor TRry may be connected to a first electrode of the OLED. The reverse bias control transistor TRry may control whether to provide the data signal Di to the first electrode of the OLED. More detailed descriptions thereof will be given with reference to FIG. 8.

Figure 8:
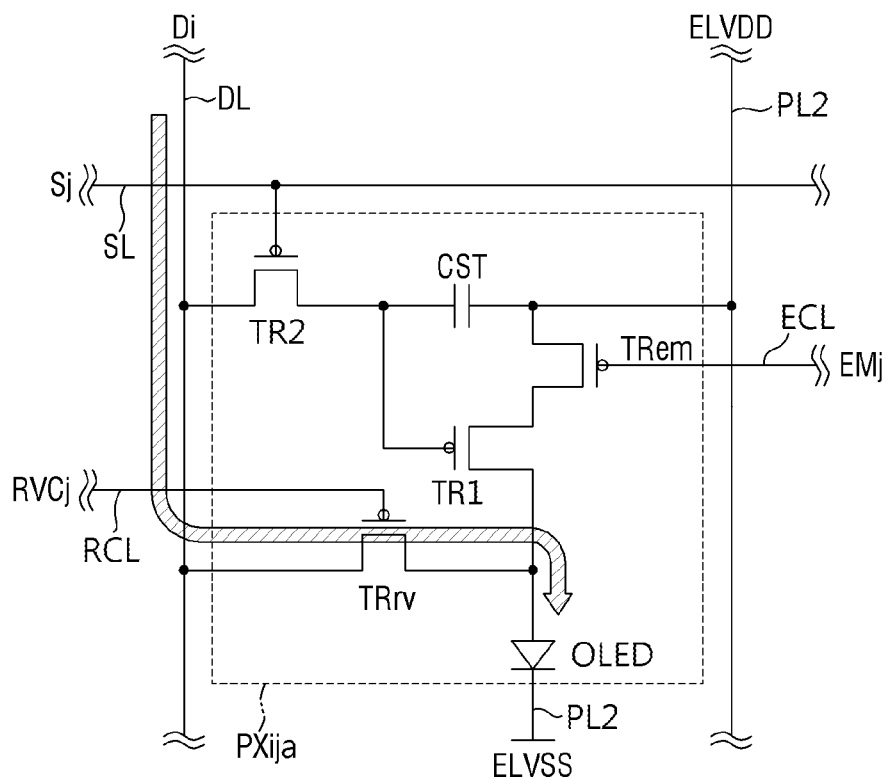
FIG. 8 is a circuit diagram illustrating a structure in which a reverse bias voltage is applied to an organic light-emitting diode ("OLED") of the pixel shown in FIG. 7.

FIG. 8 is a circuit diagram illustrating a structure in which a reverse bias voltage is applied to the OLED of the pixel shown in FIG. 7.

Referring to FIG. 8, when the reverse bias control transistor TRry is turned on, the data signal Di supplied via a data line DL may be provided to the first terminal of the OLED via the reverse bias control transistor TRrv, as indicated by the arrow. The data signal Di may have a voltage level lower than the second supply voltage ELVSS while the data signal Di is supplied to the first terminal of the OLED. Accordingly, the voltage supplied to the first terminal of the OLED becomes lower than the voltage supplied to the second terminal of the OLED, such that the reverse bias may be applied to the OLED. Accordingly, the display quality of the organic light-emitting display device may be improved, that the lifespan may be elongated.

Figure 9:
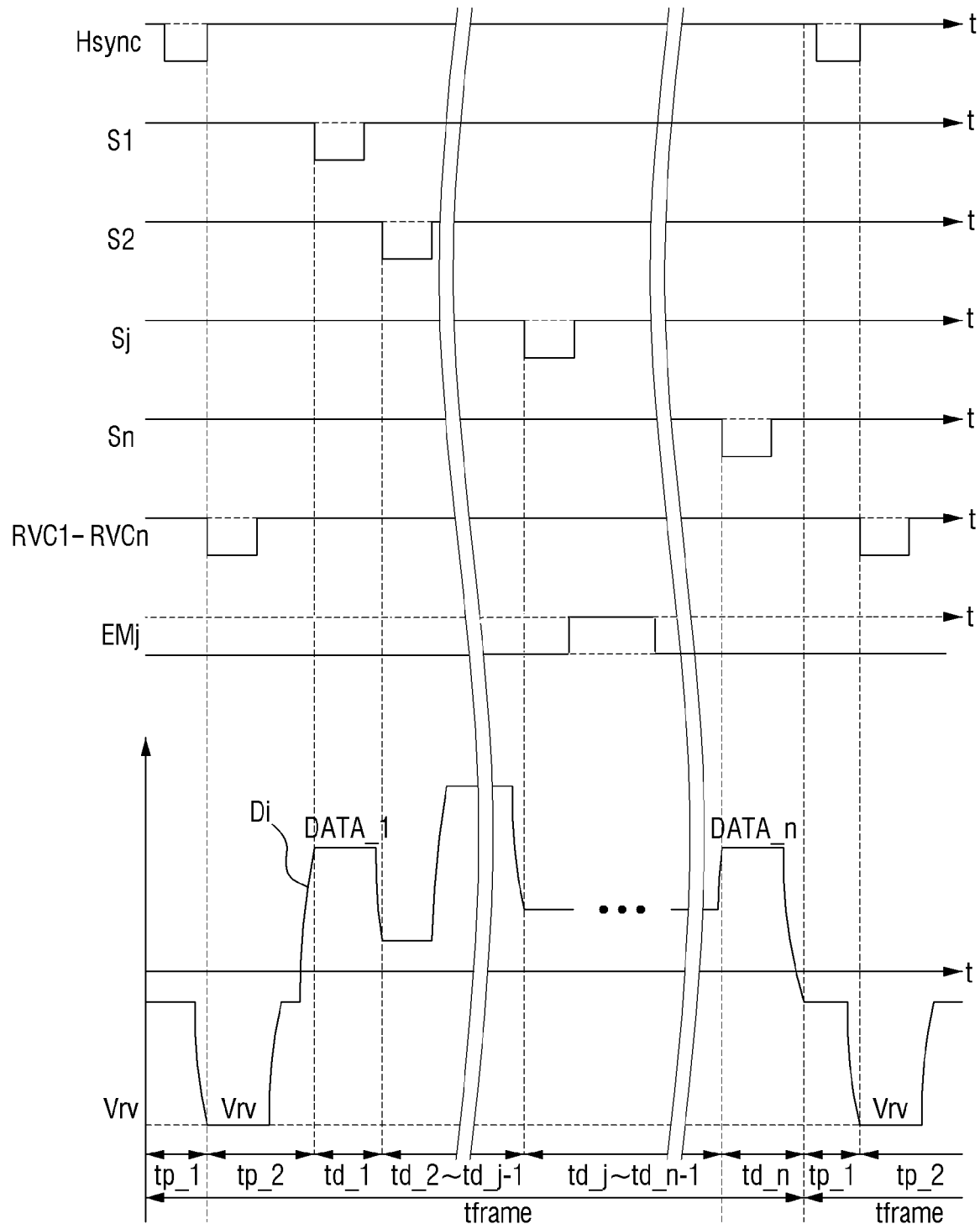
FIG. 9 is a signal timing diagram of an exemplary embodiment of signals supplied to each pixel included in the display part of the embodiment shown in FIG. 6.

FIG. 9 is a signal timing diagram of an exemplary embodiment of signals supplied to each pixel included in the display part of the embodiment shown in FIG. 6.

In the graph shown in FIG. 9, the x-axis represents the elapsed time in second. The y-axis represents levels or on/off pulse of the horizontal synchronization signal Hsync, the first to $n^{th}$ scan signal S1, S2, ..., Sj, ..., Sn, first to $n^{th}$ reverse bias control signals RVC1 to RVCn, and the $j^{th}$ emission control signal EMj. When a signal has a low value, the signal is at the on-level; otherwise, the signal is at the off-level. For the $i^{th}$ data signal Di, the y-axis represents voltage in volt (V).

Referring to FIG. 9, the horizontal synchronization signal Hsync may distinguish one frame tframe from another frame. The waveforms of the first to $n^{th}$ scan signal S1, S2, ..., Sj, ..., Sn, the first to $n^{th}$ reverse bias control signals RVC1 to RVCn and the $j^{th}$ emission control signal EMj may be repeated frame by frame. Therefore, for convenience of description, only one frame will be described in detail with reference to the graph, and any detailed descriptions of other frames will not omitted.

The frame tframe includes a first porch interval tp_1, a second porch interval tp_2, and first to $n^{th}$ data write intervals td_1, td_2, ..., td_j, ..., td_(n-1), td_n.

In the first porch interval tp_1, the horizontal synchronization signal Hsync is turned on, such that pixels PXija of FIG. 7 arranged in parallel in the horizontal direction are synchronized.

During the first porch interval tp_1, all of the first to $n^{th}$ scan signals S1, S2, ..., Sj, ..., Sn and the first to $n^{th}$ reverse bias control signals RVC1 to RVCn are maintained at the off-level, while the emission control signal is maintained at the on-level. However, the levels of these signals are merely exemplary, and these signals may have different levels as long as these signals synchronize the pixels PX arranged in parallel in the horizontal direction.

In the second porch interval tp_2, a reverse bias is applied to each of the pixels PX of FIG. 6 arranged in parallel in the vertical direction in the display part 100 (see FIG. 6) immediately after the horizontal synchronization signal Hsync is changed to the off-level. In such an embodiment, since the pixels PX of FIG. 6 arranged in parallel in the vertical direction in the display part 100 (see FIG. 6) share a same data line DL (see FIG. 7), the reverse bias may be applied simultaneously thereto during the second porch interval tp_2.

The voltage level of the $i^{th}$ data signal Di supplied to the $i^{th}$ data line DL (see FIG. 7) during the second porch interval tp_2 may have a reverse bias voltage level Vrv. The reverse bias voltage level Vrv is lower than the voltage level of the second supply voltage ELVSS. The reverse bias may be applied to the OLED (see FIG. 7) in each of the pixels PXija (see FIG. 7), which is equal to the difference between the reverse bias voltage level Vrv and the voltage level of the second supply voltage ELVSS.

In the first to $n^{th}$ data write intervals td_1, td_2, ..., td_j, td_(n-1) and td_n, the voltage level of the storage capacitor CST arranged in each pixel PX is refreshed, and the degree of emission of the OLED in each pixel PX may be controlled.

During such a frame tframe, the reverse bias may be applied to the OLED (see FIG. 7) in each pixel PXija (see FIG. 7). In such an embodiment, by using the interval in which the pixels PX arranged in parallel in the horizontal direction (see FIG. 6) are synchronized with the horizontal synchronization signal Hsync, the reverse bias may be applied to the OLED (see FIG. 7) of each pixel PX disposed in the display part 100 (see FIG. 6). Accordingly, the display quality of the organic light-emitting display device may be improved, and the lifespan may be elongated.

The waveforms and timings of the signals in one frame tframe shown in FIG. 9 are merely exemplary and not limited thereto. Alternatively, an interval for performing other functions may be added, in addition to the first porch interval tp_1, the second porch interval tp_2, and the first to $n^{th}$ data write intervals td_1, td_2, ..., td_j, td_(n-1), and td_n.

Figure 10:
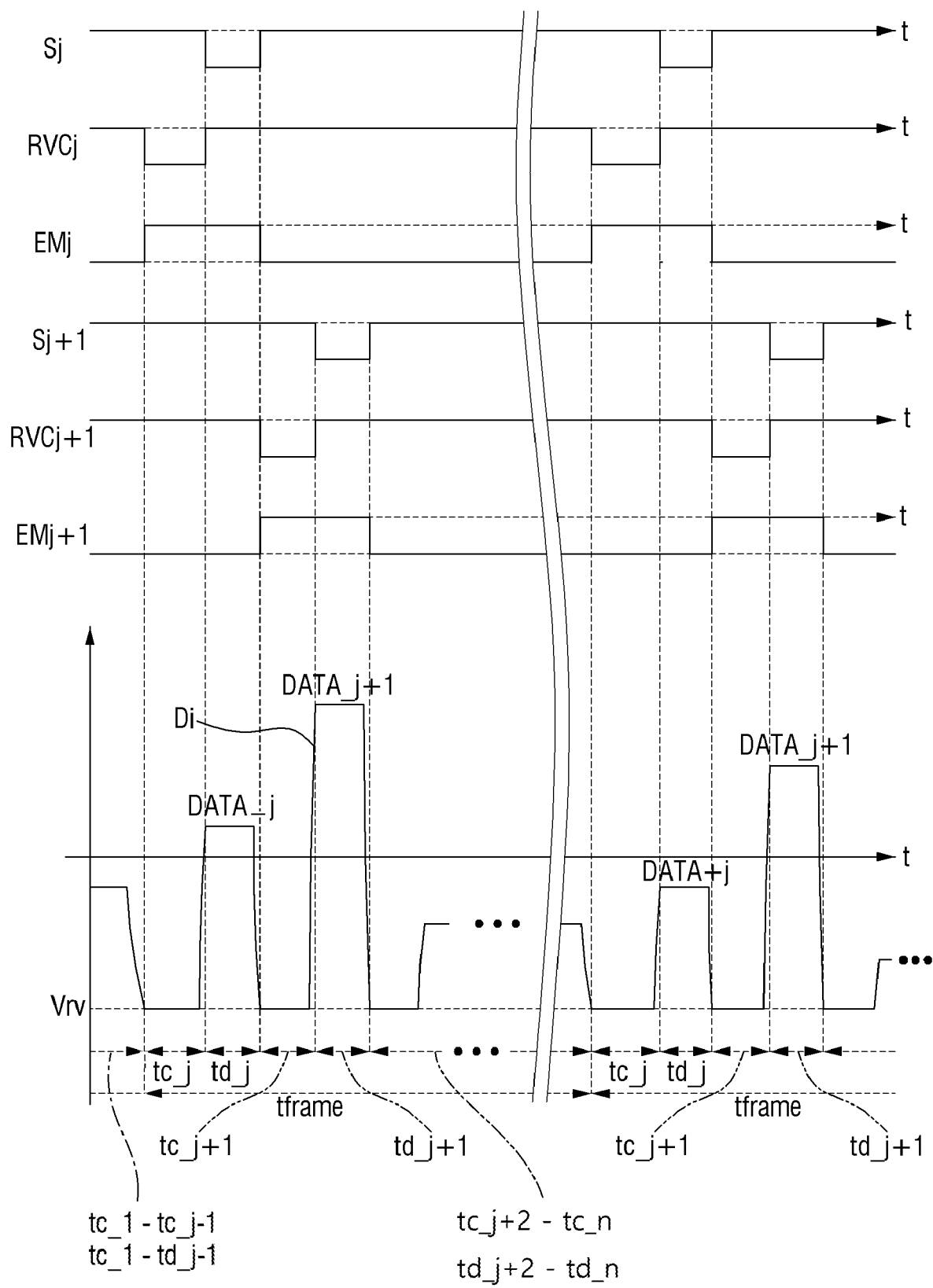
FIG. 10 is a signal timing diagram of another exemplary embodiment of signals supplied to each pixel included in the display part of the embodiment shown in FIG. 6.

FIG. 10 is a signal timing diagram of another exemplary embodiment of signals supplied to each pixel included in the display part of the embodiment shown in FIG. 6.

In the graph shown in FIG. 10, the x-axis represents the elapsed time in second. The y-axis represents on/off pulse or levels of the $i^{th}$ scan signal Sj, the $i^{th}$ reverse bias control signal RVCj, the $i^{th}$ emission control signal EMj, the $(j+1)^{th}$ scan signal S(j+1), the $(j+1)^{th}$ reverse bias control signal RVC(j+1), and the $(j+1)^{th}$ emission control signal EM(j+1). When a signal has a low value, the signal is at the on-level; otherwise, the signal is at the off-level. For the $i^{th}$ data signal Di, the y-axis represents voltage in V.

Referring to FIG. 10, a frame tframe includes first to $n^{th}$ compensation intervals tc_1, tc_2, ..., tc_(j-1), tc_j, tc_(j+1), tc_(n-1), tc_n, and first to $n^{th}$ data write interval td_1, td_2, ..., td_(j-1), td_j, td_(j+1), td_(n-1), td_n.

In such an embodiment, a frame tframe includes the first compensation interval tc_1, the first data write interval td_1, the second compensation interval tc_2, and the second data write interval td_2, which are sequentially arranged therein. In such an embodiment, the first to $n^{th}$ compensation intervals tc_1, tc_2, ..., tc_(j-1), tc_j, tc_(j+1), tc_(n-1), tc_n, and the first to $n^{th}$ data write intervals td_1, td_2, ..., td_j-1, td_j, td_(j+1), td_(n-1), td_n are arranged alternately.

In an exemplary embodiment, some of the first to $n^{th}$ compensation intervals tc_1, tc_2, ..., tc_j-1, tc_j, tc_(j+1), tc_(n-1), tc_n, and the first to $n^{th}$ data write intervals td_1, td_2, ..., td_(j-1), td_j, td_(j+1), ..., td_(n-1), td_n, e.g., the $j^{th}$ compensation interval t_cj, the $j^{th}$ data write interval tdj, and the $(j+1)^{th}$ compensation interval tc_(j+1), and the $(j+1)^{th}$ data write interval td_(j+1) will be described. In such an embodiment, other intervals of the frame tframe are substantially the same as the $j^{th}$ compensation interval tc_j, the $j^{th}$ data write interval td_j, and the $(j+1)^{th}$ compensation interval tc_(j+1), and the $(j+1)^{th}$ data write interval td_(j+1), and any repetitive detailed descriptions thereof will be omitted.

Initially, during the $j^{th}$ compensation interval tc_j, the $j^{th}$ scan signal Sj may be maintained at the off-level, the $j^{th}$ reverse bias control signal RVCj may be maintained at the on-level, the $j^{th}$ emission control signal EMj may be maintained at off-level, and the $i^{th}$ data signal Di may have a reverse bias voltage level Vrv. As described above, the reverse bias voltage level Vrv has a level lower than the level of the second supply voltage ELVSS. The reverse bias may be applied to the OLED in each pixel PX, which is equal to the difference between the reverse bias voltage level Vrv and the voltage level of the second supply voltage ELVSS. According to an exemplary embodiment of the disclosure, the reverse bias may be applied to the OLED of FIG. 7 disposed in the pixel PXija of FIG. 7 arranged in the $i^{th}$ row and the $j^{th}$ column.

Subsequently, during the $j^{th}$ data write interval td_j, the $j^{th}$ scan signal Sj may be maintained at the on-level, the $j^{th}$ reverse bias control signal RVCj may be maintained at the off-level, the $j^{th}$ emission control signal EMj may be maintained at off-level, and the $i^{th}$ data signal Di may have a voltage level DATA_j corresponding to a grayscale of the pixel PXija (see FIG. 7) disposed in the $i^{th}$ row and the $j^{th}$ column. In the $j^{th}$ data write interval td_j, the voltage level of the storage capacitor CST (see FIG. 7) disposed in the pixel PXij (see FIG. 7) disposed in the $i^{th}$ row and the $j^{th}$ column is refreshed, and the degree of emission of the OLED (see FIG. 7) in the pixel PXijs (see FIG. 7) may be controlled.

Subsequently, during the $(j+1)^{th}$ compensation interval tc_(j+1), the $(j+1)^{th}$ scan signal S(j+1) may be maintained at the off-level, the $(j+1)^{th}$ reverse bias control signal RVC(j+1) may be maintained at the on-level, the $(j+2)^{th}$ emission control signal EM(j+1) may be maintained at the off-level, and the $i^{th}$ data signal Di may have a reverse bias voltage level Vrv. As described above, the reverse bias voltage level Vrv is lower than the second supplied voltage ELVSS. The reverse bias may be applied to the OLED (see FIG. 7) in the pixel PXija (see FIG. 7), which is equal to the difference between the reverse bias voltage level Vrv and the voltage level of the second supply voltage ELVSS. According to an exemplary embodiment of the disclosure, the reverse bias may be applied to the OLED (see FIG. 7) disposed in the pixel (not shown) disposed in the $i^{th}$ row and the $j^{th}$ column.

Subsequently, during the $(j+1)^{th}$ data write interval td_(j+1), the $(j+1)^{th}$ scan signal S(j+1) may be maintained at the on-level, the $(j+1)^{th}$ reverse bias control signal RVC(j+1) may be maintained at the off-level, the $(j+1)^{th}$ emission control signal EM(j+1) may be maintained at off-level, and the $i^{th}$ data signal Di may have a voltage level DATA_(j+1) corresponding to a grayscale of the pixel (not shown) disposed in the $i^{th}$ row and the $i^{th}$ column. In the $(j+1)^{th}$ data write interval td_(j+1), the voltage level of the storage capacitor CST (see FIG. 7) disposed in the pixel (not shown) disposed in the $(j+1)^{th}$ row and the $i^{th}$ column is refreshed, and the degree of emission of the OLED (see FIG. 7) in the pixel (not shown) may be controlled.

By repeating the processes described above, one frame tframe may include the first to $n^{th}$ compensation intervals tc_1, tc_2, ..., tc_(j-1), tc_j, tc_(j+1), tc_(n-1), tc_n, and the first to $n^{th}$ data write intervals td_1, td_2, ..., td_j-1, td_j, td_(j+1), td_(n-1), td_n. In such an embodiment, by using the previous interval of the data write intervals td_1, td_2, ..., td_(j-1), td_j, td_(j+1), ..., td_(n-1), td_n of each pixel PX (see FIG. 6) disposed in the display part 100 (see FIG. 6), the reverse bias may be applied to the OLED of FIG. 7. Accordingly, the display quality of the organic light-emitting display device may be improved, and the lifespan may be elongated.

In such an embodiment, the waveforms and timings of the signals in one frame tframe shown in FIG. 10 are merely exemplary and not limited thereto. In an alternative exemplary embodiment, an interval for performing other functions may be added, in addition to the first compensation interval tc_1, the first data write interval td_1, the second compensation interval tc_2, and the second data write interval td_2.

Figure 11:
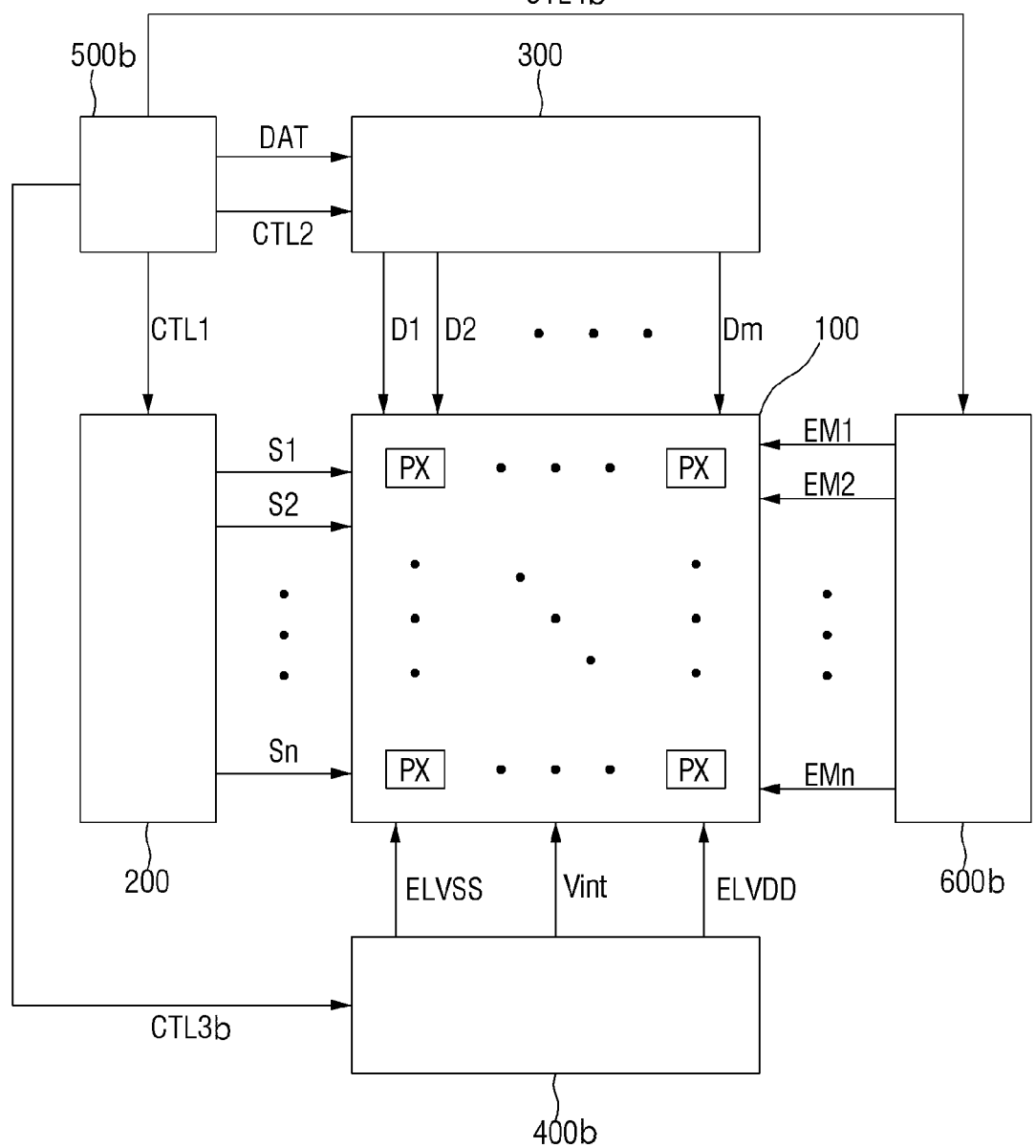
FIG. 11 is a block diagram of an organic light-emitting display device according to another alternative exemplary embodiment of the disclosure.

FIG. 11 is a block diagram of an organic light-emitting display device according to another alternative exemplary embodiment of the disclosure.

The organic light-emitting display device shown in FIG. 11 is substantially the same as the organic light-emitting display device described above with reference to FIG. 1 except that the organic light-emitting display further includes an emission control driver 600b. The same or like elements shown in FIG. 11 have been labeled with the same or like reference characters as used above to describe the exemplary embodiments of the organic light-emitting display device shown in FIG. 1, and any repetitive detailed description thereof will hereinafter be omitted or simplified.

Referring to FIG. 11, an exemplary embodiment of the organic light-emitting display device includes a display panel 100, a scan driver 200, a data driver 300, a power supplier 400b, a controller 500b, and an emission control driver 600b.

The display panel 100 includes a plurality of scan lines SL, a plurality of data lines DL intersecting the scan lines SL, and a plurality of pixels PX. In such an embodiment, the display panel 100 is substantially the same as the display panel 100 shown in FIG. 1, and any repetitive detailed description thereof will be omitted.

The scan driver 200 receives a scan driving control signal CTL1 from the controller 500b to generate scan signals S1 to Sn, and sequentially applies the scan signals S1 to Sn to the plurality of scan lines SL connected to the pixels PX. In such an embodiment, the scan driver 200 is substantially the same as the scan driver 200 shown in FIG. 1, and any repetitive detailed description thereof will be omitted.

The data driver 300 receives a data driving control signal CTL2 from the controller 500b to generate data signals D1 to Dm, and supplies the data signals D1 to Dm to the plurality of data lines DL connected to the pixels PX. In such an embodiment, the data driver 300 may be substantially the same as the data driver 300 shown in FIG. 1, and any repetitive detailed description thereof will be omitted In such an embodiment, the power supplier 400b receives a power supply control signal CTL3b from the controller 500b and generates a first supply voltage ELVDD, a second supply voltage ELVSS and an initialization supply voltage Vint. The first supply voltage ELVDD may be applied to the pixels PX via a first power line PL1. The second supply voltage ELVSS may be applied to the pixels PX via a second power line PL2. The initialization supply voltage Vint may be applied to each pixel PX via an initialization power line VIL of FIG. 12.

In such an embodiment, the power supplier 400b may not generate the third supply voltage ELVSS_rv in FIG. 1.

The controller 500b converts image signals DAT transmitted from the outside into data signals D1 to Dm and provide them to the data driver 300. The controller 500b generates the scan driving control signal CTL1 for controlling the scan driver 200, the data driving control signal CTL2 for controlling the data driver 300, and the power supply control signal CTL3b for controlling the power supplier 400b, and an emission control signal CLT4b for controlling the emission control driver 600b and provides them, respectively. In such an embodiment, the controller 500b may further generate the emission control signal CTL4b for controlling the emission control driver 600b.

Figure 12:
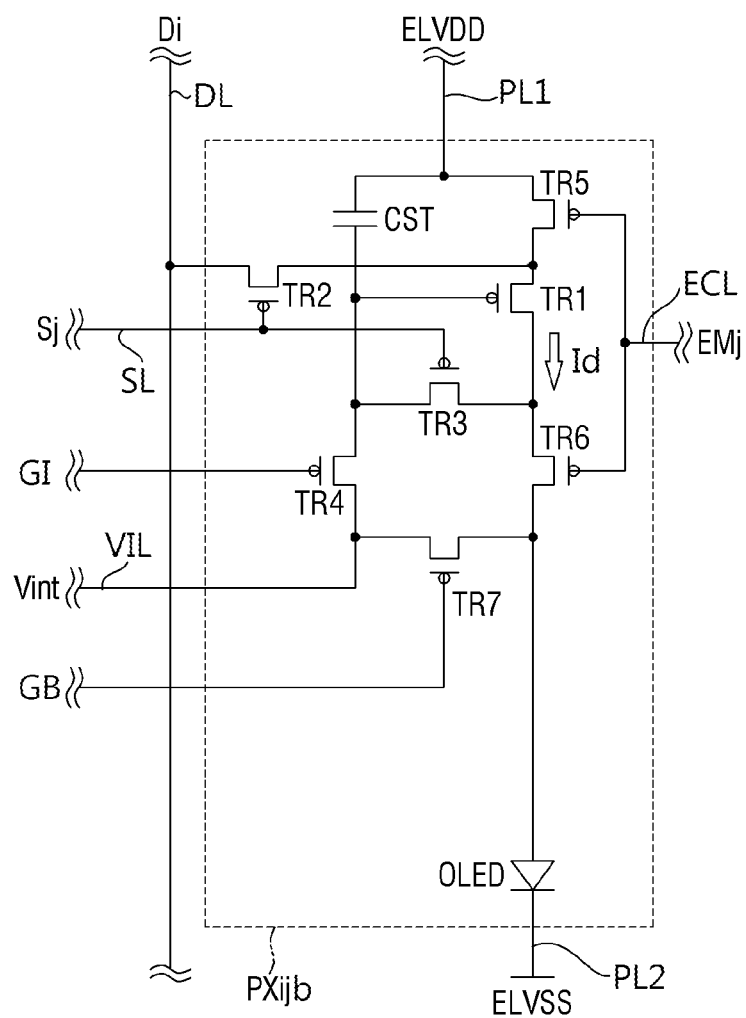
FIG. 12 is a circuit diagram of an exemplary embodiment of a pixel of the organic light-emitting display device of FIG. 11.

The emission control driver 600b generates first to $n^{th}$ emission control signals EM1 to EMn and supplies the first to the $n^{th}$ emission control signals EM1 to EMn to the pixels PX of the display part via first to $n^{th}$ emission control lines ECL, respectively (see FIG. 12).

The first to $n^{th}$ emission control signals EM1 to EMj may control the driving current Id (see FIG. 12) of the respective pixels PX, thereby controlling emission of the OLED (see FIG. 12) in each of the pixels PX.

FIG. 12 is a circuit diagram of an exemplary embodiment of a pixel of the organic light-emitting display device of FIG. 11.

The pixel PXijb of the organic light-emitting display device shown in FIG. 12 is substantially the same as the pixel PXij of the organic light-emitting display device according shown in FIG. 3 except that the pixel PXijb further includes third to seventh transistors TR3 to TR7. The same or like elements shown in FIG. 12 have been labeled with the same or like reference characters as used above to describe the exemplary embodiments of the pixel shown in FIG. 3, and any repetitive detailed description thereof will hereinafter be omitted or simplified.

Referring to FIG. 12, an exemplary embodiment of the pixel PXijb of the organic light-emitting display device includes an OLED, first to seventh transistors TR1 to TR7, and a storage capacitor CST.

The OLED may emit light based on a driving current Id. In such an embodiment, the OLED is substantially the same as the OLED shown in FIG. 3, and any repetitive detailed descriptions thereof will be omitted.

The first transistor TR1 includes a control terminal, a first terminal, and a second terminal. In such an embodiment, the first transistor TR1 is substantially the same as the first transistor TR1 according to the exemplary embodiment shown in FIG. 3, and any repetitive detailed description thereof will be omitted.

The second transistor TR2 includes a control terminal, a first terminal, and a second terminal. In such an embodiment, the second transistor TR2 is substantially the same as the second transistor TR2 shown in FIG. 3, and any repetitive detailed description thereof will be omitted.

The storage capacitor CST is electrically connected between the first power line PL1 and the control terminal of the first transistor TR1. In such an embodiment, the storage capacitor CST is substantially the same as the storage capacitor CST shown in FIG. 3, and any repetitive detailed description thereof will be omitted.

The third transistor TR3 includes a control terminal, a first terminal, and a second terminal. The control terminal of the third transistor TR3 may be electrically connected to a scan line SL to receive a scan signal Sj. The first terminal of the third transistor TR3 may be electrically connected to the second terminal of the first transistor TR1. The second terminal of the third transistor TR3 may be electrically connected to the control terminal of the first transistor TR1. In an exemplary embodiment, the first terminal of the third transistor TR3 may be a source terminal and the second terminal of the third transistor TR3 may be a drain terminal. In an alternative exemplary embodiment, the first terminal of the third transistor TR3 may be a drain terminal and the second terminal of the third transistor TR3 may be a source terminal.

The third transistor TR3 may electrically connect the control terminal of the first transistor TR1 with the second terminal of the first transistor TR1 while the scan signal Sj is maintained at the on-level. When the third transistor TR3 may electrically connect the control terminal of the first transistor TR1 with the second terminal of the first transistor TR1, the third transistor TR3 may operate in the linear region. Accordingly, the third transistor TR3 may allow the first transistor TR1 to be in diode-connection while the scan signal is maintained at the on-level. As the first transistor TR1 is in the diode-connection, there may be a voltage difference between the first terminal of the first transistor TR1 and the control terminal of the first transistor TR1, which is equal to the threshold voltage of the first transistor TR1. As a result, while the scan signal Sj is maintained at the on-level, the voltage level, which is the voltage level of the data signal Di supplied to the first terminal of the first transistor TR1 plus the voltage difference equal to the threshold voltage of the first transistor TR1, may be applied to the control terminal of the first transistor TR1. Accordingly, the data signal Di may be compensated by the threshold voltage of the first transistor TR1, and the compensated data signal Di may be supplied to the control terminal of the first transistor TR1. By performing the threshold voltage compensation, the non-uniformity issue of the driving current Id caused by the deviation in the threshold voltage of the first transistor TR1 can be addressed.

The fourth transistor TR4 may include a control terminal, a first terminal, and a second terminal. The control terminal of the fourth transistor TR4 may receive a data initialization signal GI from the outside. The first terminal of the fourth transistor TR4 may be electrically connected to the initialization power line VIL to receive an initialization supply voltage Vint. The second terminal of the fourth transistor TR4 may be electrically connected to the control terminal of the first transistor TR1. In an exemplary embodiment, the first terminal of the fourth transistor TR4 may be a source terminal, and the second terminal of the fourth transistor TR4 may be a drain terminal. In an alternative exemplary embodiment, the first terminal of the fourth transistor TR4 may be a drain terminal, and the second terminal of the fourth transistor TR4 may be a source terminal.

The fourth transistor TR4 may supply the initialization supply voltage Vint to the control terminal of the first transistor TR1 during the activation period of the initialization signal GI. By supplying the initialization supply voltage Vint to the control terminal of the first transistor TR1, the fourth transistor TR4 may operate in the linear region. That is, the fourth transistor TR4 may initialize the control terminal of the first transistor TR1 with the initialization supply voltage Vint during the activation period of the initialization signal GI. In an exemplary embodiment, the voltage level of the initialization supply voltage Vint may have a voltage level substantially or effectively lower than the voltage level of the data signal Di held by the storage capacitor CST in the previous frame. In such an embodiment, the initialization supply voltage Vint may be supplied to the control terminal of the first transistor TR1 which is a p-channel metal oxide semiconductor ("PMOS") transistor. In an alternative exemplary embodiment, the voltage level of the initialization supply voltage Vint may have a voltage level substantially or effectively higher than the voltage level of the data signal Di held by the storage capacitor CST in the previous frame. In such an embodiment, the initialization supply voltage Vint may be supplied to the control terminal of the first transistor TR1 which is an n-channel metal oxide semiconductor ("NMOS") transistor.

The fifth transistor TR5 may supply the first supply voltage ELVDD to the first terminal of the first transistor TR1 while the emission control signal EMj is maintained at the on-level. In such an embodiment, the fifth transistor TR5 may interrupt the supply of the first supply voltage ELVDD while the emission control signal EMj is maintained at the off-level. Accordingly, the fifth transistor TR5 may operate in the linear region. The first supply voltage ELVDD may be supplied to the first terminal of the first transistor TR1 while the emission control signal EMj is maintained at the on-level, such that the first transistor TR1 may generate the driving current id. In such an embodiment, as the fifth transistor TR5 interrupts the supply of the first supply voltage ELVDD while the emission control signal EMj is maintained at the off-level, the data signal Di supplied to the first terminal of the first transistor TR1 may be supplied to the control terminal of the first transistor TR1.

The sixth transistor TR6 may include a control terminal, a first terminal, and a second terminal. The control terminal of the sixth transistor TR6 may receive an emission control signal EMj. The first terminal of the sixth transistor TR6 may be electrically connected to the second terminal of the first transistor TR1. The second terminal of the sixth transistor TR6 may be connected to the first terminal of the OLED. In an exemplary embodiment, the first terminal of the sixth transistor TR6 may be a source terminal, and the second terminal of the sixth transistor TR6 may be a drain terminal. In an alternative exemplary embodiment, the first terminal of the sixth transistor TR6 may be a drain terminal, and the second terminal of the sixth transistor TR6 may be a source terminal.

In such an embodiment, the sixth transistor TR6 may provide the driving current Id generated by the first transistor TR1 to the OLED while the emission control signal EMj is maintained at the on-level. Accordingly, the sixth transistor TR6 may operate in the linear region. In such an embodiment, as the sixth transistor TR6 provides the driving current Id generated by the first transistor TR1 to the OLED while the emission control signal EMj is maintained at the on-level, the OLED may emit light. In such an embodiment, as the sixth transistor TR6 electrically isolates the first transistor TR1 from the OLED while the emission control signal EMj is maintained in the off-state, the data signal Di supplied to the second terminal of the first transistor TR1 (e.g., the data signal with the threshold voltage compensated) may be supplied to the control terminal of the first transistor TR1.

The seventh transistor TR7 includes a control terminal, a first terminal, and a second terminal. The control terminal of the seventh transistor TR7 may receive a diode initialization signal GB from the outside. The first terminal of the seventh transistor TR7 may be electrically connected to the initialization power line VIL to receive an initialization supply voltage Vint. The second terminal of the seventh transistor TR7 may be electrically connected to the first terminal of the OLED. In an exemplary embodiment, the first terminal of the seventh transistor TR7 may be a source terminal and the second terminal of the seventh transistor TR7 may be a drain terminal. In an alternative exemplary embodiment, the first terminal of the seventh transistor TR7 may be a drain terminal, and the second terminal of the seventh transistor TR7 may be a source terminal.

The seventh transistor TR7 may supply the initialization supply voltage Vint to the first terminal of OLED while the diode initialization signal GB is maintained at the on-level. By supplying the initialization supply voltage Vint to the first terminal of OLED, the seventh transistor TR7 may operate in the linear region. In such an embodiment, the seventh transistor TR7 may initialize the first terminal of the OLED with the initialization supply voltage Vint while the diode initialization signal GB is maintained at the on-level.

In such an embodiment, a reverse bias may be applied to the OLED by the initialization supply voltage Vint. More detailed descriptions thereof will be given with reference to FIG. 13.

Figure 13:
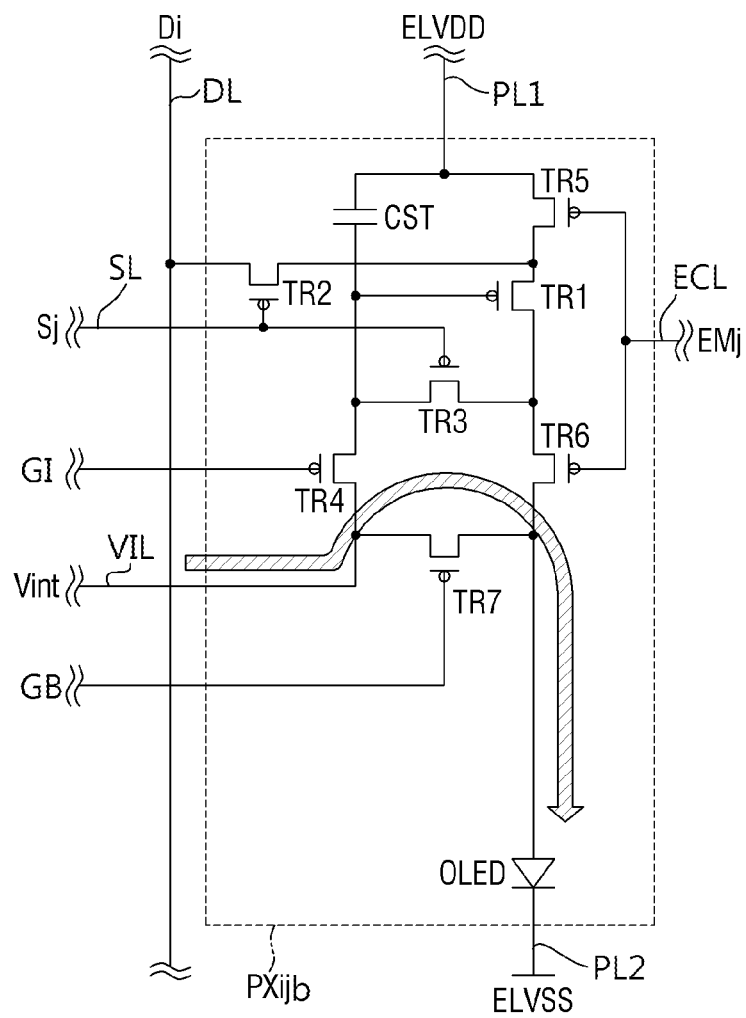
FIG. 13 is a circuit diagram illustrating a structure in which an initialization supply voltage is applied to the OLED of one pixel shown in FIG. 12.

FIG. 13 is a circuit diagram illustrating a structure in which an initialization supply voltage is applied to the OLED of one pixel shown in FIG. 12.

Referring to FIG. 13, the initialization supply voltage Vint provided to the first terminal of the seventh transistor TR7 via the initialization power line VIL may be applied to the first terminal of the OLED via the seventh transistor TR7. The initialization supply voltage Vint may have a lower value than the second supply voltage ELVSS. In such an embodiment, the initialization supply voltage Vint may have a value lower than the second supply voltage ELVSS while the seventh transistor TR7 is kept turned on, that is, while the diode initialization signal GB is maintained at the on-level. A reverse bias voltage, which is equal to the difference between the initialization supply voltage Vint and the second supply voltage ELVSS, may be applied to the OLED.

In an exemplary embodiment, the initialization supply voltage Vint may have two values. In such an embodiment, the initialization supplied voltage Vint may have one of a first initializing voltage (not shown) for removing the charges remaining at the first terminal of the OLED to initialize the OLED, and a second initializing voltage (not shown) for applying the reverse bias to the OLED.

Both of the first initializing voltage and the second initializing voltage may have a voltage level lower than that of the second supply voltage ELVSS. The second initializing voltage may have a voltage level lower than that of the first initializing voltage. In such an embodiment, the applied reverse bias may be greater when the second initializing voltage is applied to the first terminal of the OLED than when the first initializing voltage is applied to the first terminal of the OLED.

The first to sixth transistors TR1 to TR6 may be kept in the off-state while the diode initialization signal GB is maintained at the on-level and the seventh transistor TR7 is maintained in the on-state, but not being limited thereto. Some of the first to sixth transistors TR1 to TR6 may be maintained in the on-state unless the voltage levels of the first terminal and the second terminal of the OLED are changed, and may perform other functions than the function of applying a reverse bias to the OLED.

The effects of the invention are not limited by the foregoing, and other various effects are anticipated herein.

Although some embodiments of the invention have been disclosed for illustrative purposes, those skilled in the art will appreciate that various modifications, additions and substitutions are possible, without departing from the scope and spirit of the invention as disclosed in the accompanying claims.

What is claimed is:
1. An organic light-emitting display device comprising:
a plurality of pixels, wherein each of the pixels is connected to a scan line, a data line, a first power line and a second power line, and each of the pixels comprises a light-emitting diode,
wherein the first power line is connected to an anode of the light-emitting diode, and the second power line is connected to a cathode of the light-emitting diode,
wherein a voltage applied to the anode of the light-emitting diode in a first operation period is higher than a voltage applied to the cathode of the light-emitting diode in the first operation period,
wherein a voltage applied to the anode of the light-emitting diode in a part of a second operation period, which is different from the first operation period, is lower than a voltage applied to the cathode of the light-emitting diode in the part of the second operation period,
wherein a voltage applied to the first power line in the first operation period is lower than a voltage applied to the second power line in the part of the second operation period, and
wherein a voltage applied to the second power line in the first operation period is lower than a voltage applied to the first power line in the part of the second operation period.

2. The organic light-emitting display device according to claim 1, wherein
the light-emitting diode emits light in the first operation period, and
the light-emitting diode is turned off in the part of the second operation period.

3. The organic light-emitting display device according to claim 1, wherein
the light-emitting diode is driven with a scan signal supplied to the scan line, a data signal supplied to the data line, a first supply voltage supplied to the first power line, and a second supply voltage supplied to the second power line, and
each of the pixels further comprises:
a first switching element connected to the first power line and the light-emitting diode; and
a second switching element connected to the data line and the scan line, wherein
the first supply voltage is applied to the anode of the light-emitting diode via the first switching element,
the data signal is supplied to a control terminal of the first switching element via the second switching element, and
the scan signal is supplied to a control terminal of the second switching element.

4. The organic light-emitting display device according to claim 1, wherein
the first power line is supplied with the first supply voltage to be applied to the anode of the light-emitting diode,
the second power line is supplied with the second supply voltage or a third supply voltage to be applied to the cathode of the light-emitting diode, and
the second supply voltage and the third supply voltage have different voltage levels from each other.

5. The organic light-emitting display device according to claim 4, wherein
the second supply voltage is supplied to the second power line in the first operation period, and
the third supply voltage is supplied to the second power line in the part of the second operation period.

6. The organic light-emitting display device according to claim 5, wherein
the second supply voltage has a voltage level lower than a voltage level of the first supply voltage, and
the third supply voltage has a voltage level higher than the voltage level of the first supply voltage.

7. The organic light-emitting display device according to claim 1, wherein
the plurality of pixels displays an image at each frame,
each frame comprises a porch interval and first to $n^{th}$ data write intervals, wherein n is a natural number.

8. The organic light-emitting display device according to claim 7, wherein the plurality of pixels is arranged in n rows.

9. The organic light-emitting display device according to claim 8, wherein the voltage applied to the anode of the light-emitting diode in each of the pixels in a part of the pouch interval is lower than the voltage applied to the cathode of the light-emitting diode in the part of the porch interval.

10. The organic light-emitting display device according to claim 1, wherein
the plurality of pixels displays an image at each frame,
each frame comprises first to $n^{th}$ compensation intervals and first to $n^{th}$ data write intervals, wherein n is a natural number greater than 1.

11. The organic light-emitting display device according to claim 10, wherein the first to the $n^{th}$ compensation intervals and the first to the $n^{th}$ data write intervals are alternated arranged in each frame.

12. The organic light-emitting display device according to claim 10, wherein the plurality of pixels is arranged in n rows.

13. The organic light-emitting display device according to claim 12, wherein a voltage applied to the anode of the light-emitting diode in a pixel disposed at a k-th row is lower than the voltage applied to the cathode of the light-emitting diode in the pixel disposed at the k-th row in a part of a k-th compensation interval, where k is a natural number equal to or less than n.

14. An organic light-emitting display device comprising:
a plurality of pixels, wherein each of the pixels is connected to a scan line, a data line, a first power line and a second power line,
wherein each of the plurality of pixels includes:
a light-emitting diode;
a first transistor between the first power line and an anode of the light-emitting diode;
a second transistor between the data line and a control terminal of the first transistor;
an emission control transistor between the first power line and the first transistor, wherein the emission control transistor and the first transistor are connected to each other in series; and
a reverse bias control transistor between the data line and the anode of the light-emitting diode,
wherein the second transistor and the emission control transistor are turned off and the reverse bias control transistor is turned on during a first period,
the second transistor is turned on, and the reverse bias control transistor and the emission control transistor are turned off during a second period after the first period,
the emission control transistor is turned on, and the second transistor and the reverse bias control transistor are turned off during a third period after the second period,
a first supply voltage applied to a first power line and a second supply voltage applied to a second power line are constant, and
a light-emitting diode of each of a plurality of pixels to which a j-th emission control signal is applied emits light, and then a light-emitting diode of each of a plurality of pixels to which a (j+1)-th emission control signal is applied emits light.

15. The organic light-emitting display device according to claim 14,
wherein
each of the pixels further comprises a third switching element,
wherein the anode of the light-emitting diode is connected to the data line via the third switching element.

16. The organic light-emitting display device according to claim 15, wherein the third switching element is turned on when the data signal has the voltage level lower than the voltage level of the voltage applied to the cathode of the light-emitting diode in the part of the second operation period.

* * * * *